(12) United States Patent
Morin et al.

(10) Patent No.: US 10,903,423 B2
(45) Date of Patent: Jan. 26, 2021

(54) PHASE CHANGE MEMORY

(71) Applicants: STMicroelectronics (Crolles 2) SAS, Crolles (FR); STMicroelectronics S.r.l., Agrate Brianza (IT)

(72) Inventors: Pierre Morin, Kessel-Lo (BE); Michel Haond, Crolles (FR); Paola Zuliani, Milan (IT)

(73) Assignees: STMicroelectronics (Crolles 2) SAS, Crolles (FR); STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 16/708,604

(22) Filed: Dec. 10, 2019

(65) Prior Publication Data

US 2020/0119269 A1 Apr. 16, 2020

Related U.S. Application Data

(62) Division of application No. 15/953,921, filed on Apr. 16, 2018, now Pat. No. 10,510,955.

(30) Foreign Application Priority Data

Apr. 18, 2017 (FR) ...................... 17 53345

(51) Int. Cl.
*H01L 45/00* (2006.01)
*H01L 27/24* (2006.01)

(52) U.S. Cl.
CPC ........ *H01L 45/126* (2013.01); *H01L 27/2436* (2013.01); *H01L 27/2463* (2013.01); *H01L 27/2472* (2013.01); *H01L 45/06* (2013.01); *H01L 45/065* (2013.01); *H01L 45/124* (2013.01); *H01L 45/1233* (2013.01); *H01L 45/1293* (2013.01); *H01L 45/144* (2013.01); *H01L 45/16* (2013.01); *H01L 45/1608* (2013.01)

(58) Field of Classification Search
CPC . H01L 45/1233; H01L 45/124; H01L 45/126; H01L 45/1608; H01L 27/2472
See application file for complete search history.

(56) References Cited

U.S. PATENT DOCUMENTS

| 8,822,969 | B2 | 9/2014 | Hwang |
| 8,871,559 | B2 | 10/2014 | Horii et al. |
| 2012/0211720 | A1 | 8/2012 | Kang et al. |
| 2013/0062586 | A1 | 3/2013 | Ren |
| 2014/0124726 | A1 | 5/2014 | Oh |
| 2015/0028283 | A1 | 1/2015 | Redaelli et al. |

FOREIGN PATENT DOCUMENTS

KR 1020110084791 A 7/2011

OTHER PUBLICATIONS

INPI Search Report and Written Opinion for FR 1753345 dated Dec. 21, 2017 (6 pages).

*Primary Examiner* — Allison Bernstein
(74) *Attorney, Agent, or Firm* — Crowe & Dunlevy

(57) ABSTRACT

A phase change memory includes an L-shaped resistive element having a first part that extends between a layer of phase change material and an upper end of a conductive via and a second part that rests at least partially on the upper end of the conductive via and may further extend beyond a peripheral edge of the conductive via. The upper part of the conductive via is surrounded by an insulating material that is not likely to adversely react with the metal material of the resistive element.

22 Claims, 4 Drawing Sheets

PHASE CHANGE MEMORY

CROSS REFERENCE TO RELATED APPLICATION

This application is a divisional from United States Applications for patent Ser. No. 15/953,921 filed Apr. 16, 2018, which claims the priority benefit of French Application for Patent No. 1753345, filed on Apr. 18, 2017, the disclosures of which are hereby incorporated by reference in their entireties to the maximum extent allowable by law.

TECHNICAL FIELD

The present application relates to an electronic circuit, and more particularly to Phase Change Memory (PCM).

BACKGROUND

A phase change material may switch, under the effect of heat, between a crystalline phase and an amorphous phase. As the electrical resistance of an amorphous material is significantly greater than the electrical resistance of a crystalline material, it is possible to determine two memorizable states (e.g., 0 and 1) of the phase change material differentiated by the measured resistance.

SUMMARY

In an embodiment, a phase change memory includes an L-shaped resistive element, wherein a first part of the resistive element extends between a layer of phase change material and the upper end of a conductive via, and a second part of the resistive element rests at least partially on the upper end of the conductive via, the upper part of the conductive via being surrounded by an insulator not likely to react with the resistive element.

According to one embodiment, the insulator is silicon nitride.

According to one embodiment, the phase change material is an alloy including germanium, antimony and tellurium.

According to one embodiment, the conductive via has a diameter of less than 35 nm.

According to one embodiment, the resistive element is made of titanium nitride.

In an embodiment, a method for manufacturing phase change memory includes: depositing a first layer of a first insulator on a second insulator; forming conductive vias traversing the layer of first insulator and the second insulator; depositing a second layer of the first insulator; forming a cavity in the second layer of first insulator that extends from one via to the other and at least partially reveals the upper end of each of the vias; depositing a layer of resistive material, wherein the first insulator is not likely to react with the resistive material; forming first spacers in the first insulator on the flanks of the cavity; etching the resistive material not protected by the first spacers; forming second spacers in the first insulator on the flanks of the cavity; filling the second insulator cavity; and depositing a layer of phase change material.

According to one embodiment, the first insulator is silicon nitride.

According to one embodiment, the second insulator is silicon oxide.

According to one embodiment, the thickness of the first layer of first insulator is between 10 and 30 nm.

According to one embodiment, the thickness of the layer of resistive material is between 3 and 6 nm.

According to one embodiment, the resistive material is titanium nitride.

BRIEF DESCRIPTION OF THE DRAWINGS

These features and advantages, as well as others, will be disclosed in detail in the following non-restrictive description of particular embodiments in relation to the accompanying figures in which.

DETAILED DESCRIPTION

The same elements have been designated by the same references in the different figures and, in addition, the various figures are not drawn to scale. For the sake of clarity, only the elements useful to the understanding of the embodiments described have been represented and are given in detail. In particular, the different etching masks are neither described nor represented.

In the description that follows, when reference is made to terms such as "upper", "vertical", "horizontal", "left" or "right", etc., it refers to the orientation of the figures. The term "vertical" is to be understood as within 10 degrees. Unless otherwise specified, the expression "substantially" means within 10%, preferably within 5%.

Figure 1:
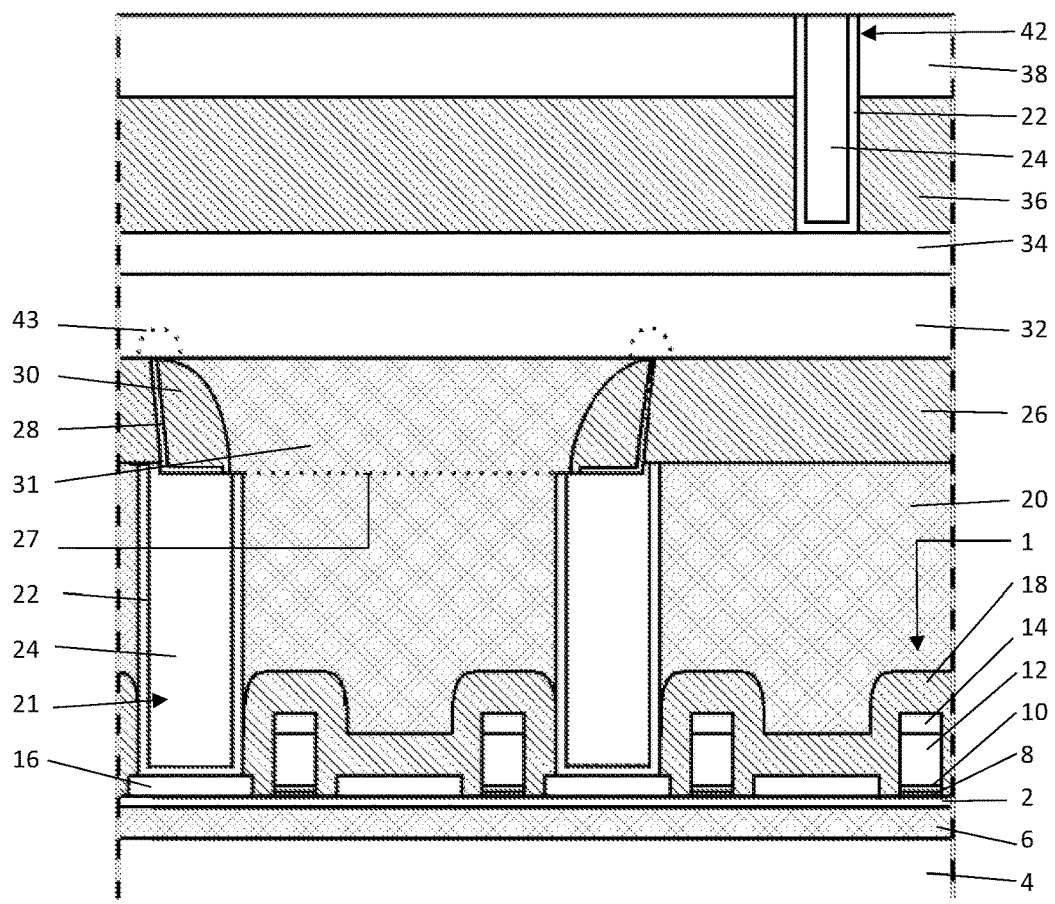
FIG. 1 is a sectional view of two phase change memory elements.

FIG. 1 is a sectional view of two phase change memory elements. Selector transistors 1 are formed in and on a silicon-on-insulator (SOI) substrate structure. The SOI structure is composed of a thin layer 2 of silicon in which the drain/source areas are formed. The thin layer 2 is separated from a substrate 4 (e.g. made of silicon) by a layer 6 of insulator (e.g. silicon oxide; BOX—buried oxide). Each selector transistor 1 gate is, for example, composed of a layer 8 of high permittivity material, a layer 10 of metal material and a layer 12 of polycrystalline silicon covered with a layer 14 of a metal silicide. The drain/source areas are covered with a layer 16 of a metal silicide. The transistors 1 and the layers 16 are covered with a layer 18 of silicon nitride, and a layer 20 of silicon oxide.

Two conductive vias 21 traverse the layer 20 of silicon oxide and the layer 18 of silicon nitride. Each via 21 reaches the layer 16 of silicide covering a drain/source area. Each via 21 is sheathed with a layer 22 of conductive protection (e.g. made of Ti/TiN) and comprises a conductive core 24 (e.g. made of tungsten).

The layer 20 of silicon oxide and the conductive vias 21 are covered with a layer 26 of silicon nitride, in which a cavity 27 is etched. The cavity 27 extends from one conductive via 21 to an adjacent conductive via and at least partially reveals the upper end of the two adjacent conductive vias 21. L-shaped resistive elements 28 are formed on the flanks of this cavity. One part (or leg), substantially vertical, of each L-shaped resistive element 28 extends along the layer 26 of silicon nitride and another, horizontal, part (or leg) of the L-shaped resistive element extends over the upper end of a conductive via 21. The resistive elements 28, with the exception of their upper ends, are covered with spacers 30 (e.g. made of silicon nitride). The rest of the cavity is filled with an insulator 31 (e.g. silicon oxide).

The whole of the structure described so far is covered with a layer 32 of phase change material (e.g. an alloy including germanium, antimony and tellurium). The layer 32 is in contact with the upper end of each resistive element 28. The layer 32 is covered with a layer 34 of conductive material, a layer 36 of insulator (e.g. silicon nitride) and a layer 38 of insulator (e.g. silicon oxide).

A via 42 traverses the layers of insulators 36 and 38 so as to make contact with the layer 34 of conductive material. The via 42 is sheathed with a layer 22 of conductive protection (e.g. made of Ti/TiN) and comprises a conductive core (e.g. made of tungsten).

When writing to a phase change memory element, a current is sent between a via 21 and the conductive layer 34 to the via 42. The intensity of this current is chosen so as to increase the temperature of the resistive element 28 sufficiently to make an area 43 of the layer 32 of phase change material in contact with the upper end of the resistive element 28 switch from the weakly resistive crystalline phase to the highly resistive amorphous phase. It is assumed, for example, that the crystalline phase corresponds to the value 0 and the amorphous phase corresponds to the value 1.

When reading from a phase change memory, a current, having a sufficiently low intensity not to lead to phase change, is sent between the vias 21 and 42 so as to measure the resistance between them and therefore to determine the value, 0 or 1, stored in memory.

The position of the resistive elements 28 is determined by the position of a mask used for delimiting the etching of the cavity 27. This mask has to be aligned with the masks used previously, notably for defining the vias 21, but alignment errors may occur the value of which may range, for example, up to 20 nm. For a via 21 having, for example, a diameter equal to 150 nm, such an error does not pose a problem. However, in the case of a via 21 having, for example, a diameter of less than 35 nm (e.g. between 25 and 35 nm) it is possible to obtain a situation such as that illustrated in FIG. 2.

Figure 2:
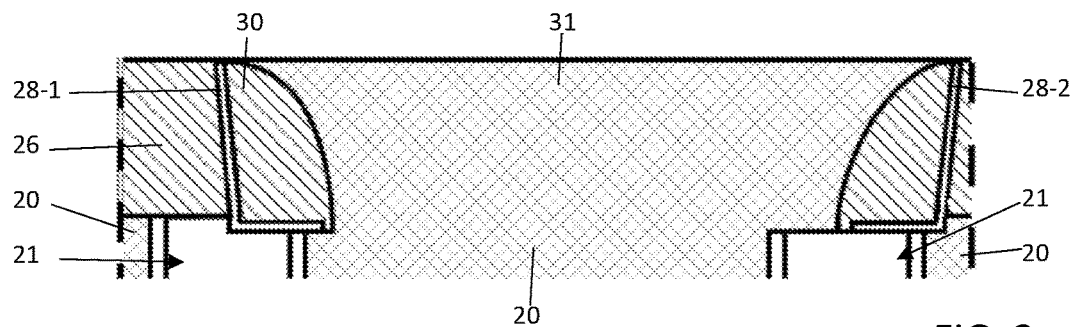
FIG. 2 is a partial sectional view of elements of a phase change memory.

FIG. 2 illustrates a case in which a mask alignment error has occurred. This alignment error causes the shift to the right or to the left of the two resistive elements, that will be designated here by the references 28-1 and 28-2, with respect to the vias 21.

The resistive element 28-1 is shifted to the right in the direction of the other via 21. The horizontal part of the resistive element 28-1 then extends partially over the via 21 and includes a part that extends past the peripheral edge of the via and partially over and in contact with the layer 20 of silicon oxide.

The resistive element 28-2 is also shifted to the right. Thus, the area where the horizontal and vertical parts of the resistive element 28-2 meet is located in the layer 20 of silicon oxide.

The two resistive elements are therefore in contact with the silicon oxide which may lead to oxidation of the elements 28-1 and 28-2 and a variation in their short-term or long-term resistances. This oxidation may cause an increase in the resistivity of the elements 28-1 and 28-2, which could, for example, no longer be able to reach the temperature required for the phase change and therefore for storage in memory.

This problem may also arise in a case where the mask is perfectly aligned. Indeed, the horizontal parts of the resistive elements 28-1 and 28-2 are rectangular in shape and the conductive vias 21 are, for example, circular in shape. Reducing the diameter of the vias 21 may therefore lead to the resistive elements overrunning at the corners. For example, for vias having a diameter of less than 35 nm (e.g. between 25 and 35 nm) and for resistive elements the horizontal part of which has dimensions of 25 nm by 50 nm, there will be overflow of the resistive elements 28-1 and 28-2 onto the silicon oxide 20 regardless of the mask's alignment.

In the case described in relation to FIG. 2, the resistive elements 28-1 and 28-2 are shifted in the same direction. The resistive elements may, however, be shifted in opposite directions, one to the left, the other to the right.

It would be desirable to provide phase change memory the resistive element of which is protected against oxidation.

Figure 3:
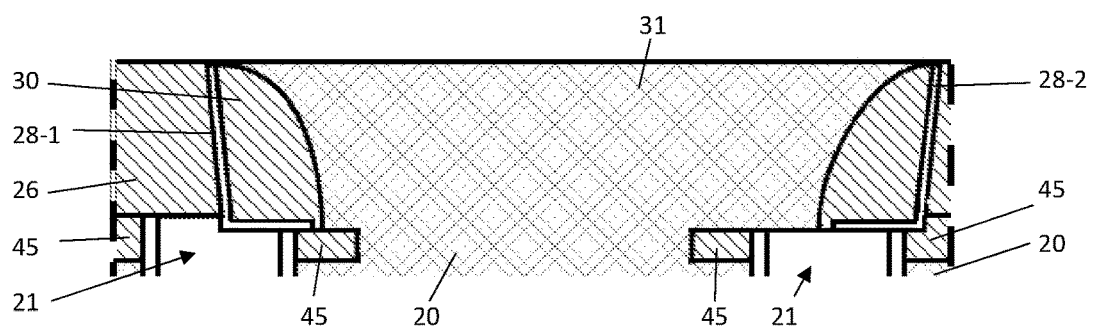
FIG. 3 is a partial sectional view of elements of an embodiment of phase change memory.

FIG. 3 partially illustrates an embodiment of a phase change memory. The part represented is similar to the part represented in FIG. 2. Furthermore, an insulating region 45, surrounds the upper end of each via 21 and is located above the layer 20 of silicon oxide. The insulator forming the regions 45 is an insulator that is not likely to react with the resistive elements 28-1 and 28-2 at temperatures below 1000 C, in particular not likely to cause oxidation of the material of the resistive elements 28. The insulator forming the regions 45 is, for example, a dielectric material not including oxygen (e.g. silicon nitride). The regions 45 are sufficiently extensive so that, regardless of the overrunning of the resistive elements 28-1 and 28-2 with respect to the vias 21, the resistive elements are not in contact with the layer 20 of silicon oxide.

By way of example, the resistive elements 28-1 and 28-2, with the exception of their lower part in contact with the via 21 and their upper end in contact with the phase change material, are completely surrounded by silicon nitride 26, 30 and 45 and are nowhere in contact with a material likely to react with them such as silicon oxide which is likely to oxidize them. The parts of the resistive elements 28 that extend out past the peripheral edge of the via 21 are insulated from the oxide material by the nitride material.

FIGS. 4A to 4E are sectional views of successive steps of an embodiment of a method for manufacturing elements of a phase change memory such as those illustrated in FIG. 3.

Figure 4A:
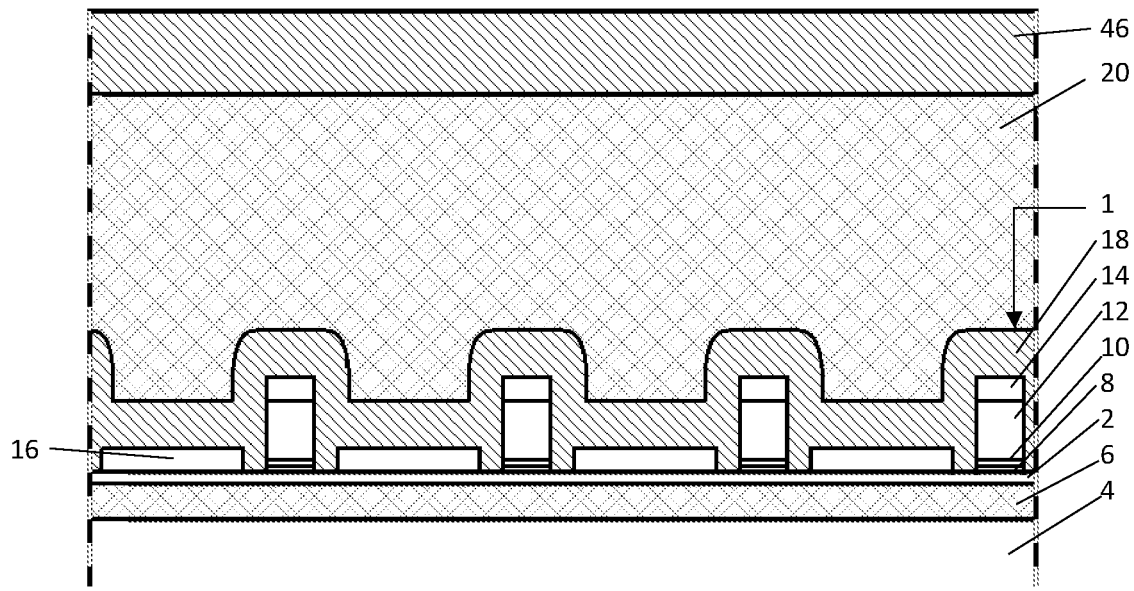
FIGS. 4A to 4F are steps of an embodiment of a method for manufacturing phase change memory elements.

In the step illustrated in FIG. 4A, initial steps have been performed. In particular, transistors 1 have been formed in and on an SOI structure including the substrate 4, the layer 6 of silicon oxide and the thin layer 2 of silicon. Each transistor 1 gate is composed of a layer 8 of high permittivity material, a layer 10 of metal material and a layer 12 of polycrystalline silicon covered with a layer 14 of a metal silicide. The drain/source areas of these transistors 1 are preferably covered with a layer 16 of a metal silicide. The initial steps also include the formation of a layer 18 of silicon nitride and a layer 20 of silicon oxide with a flat upper surface covering the structure.

A layer 46 of silicon nitride is then formed on the layer 20 of silicon oxide of the initial structure. The layer 46 has a thickness of between 10 and 30 nm (e.g. 20 nm). Portions of this layer 46 will correspond to the areas 45 illustrated in FIG. 3.

Figure 4B:
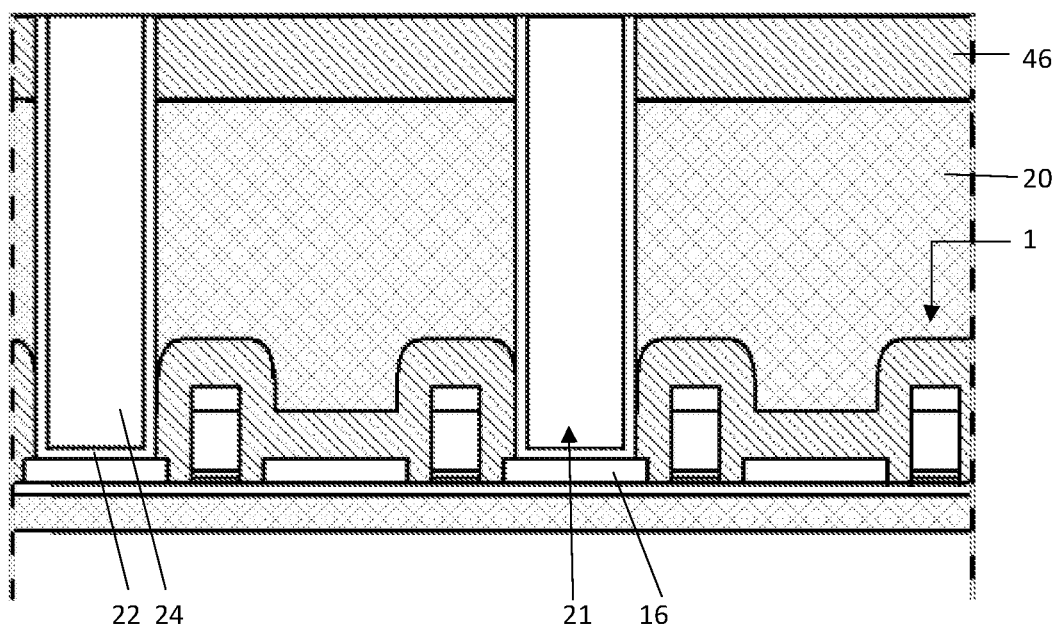

In the step illustrated in FIG. 4B, conductive vias 21 have been formed traversing the nitride layer 46, the layer of silicon oxide 20 and the layer of silicon nitride 18, so as to make contact with the layers 16 of silicide covering drain/source areas. Each via 21 is sheathed with a layer 22 of conductive protection (e.g. made of Ti/TiN) and comprises a conductive core 24 (e.g. made of tungsten).

Figure 4C:
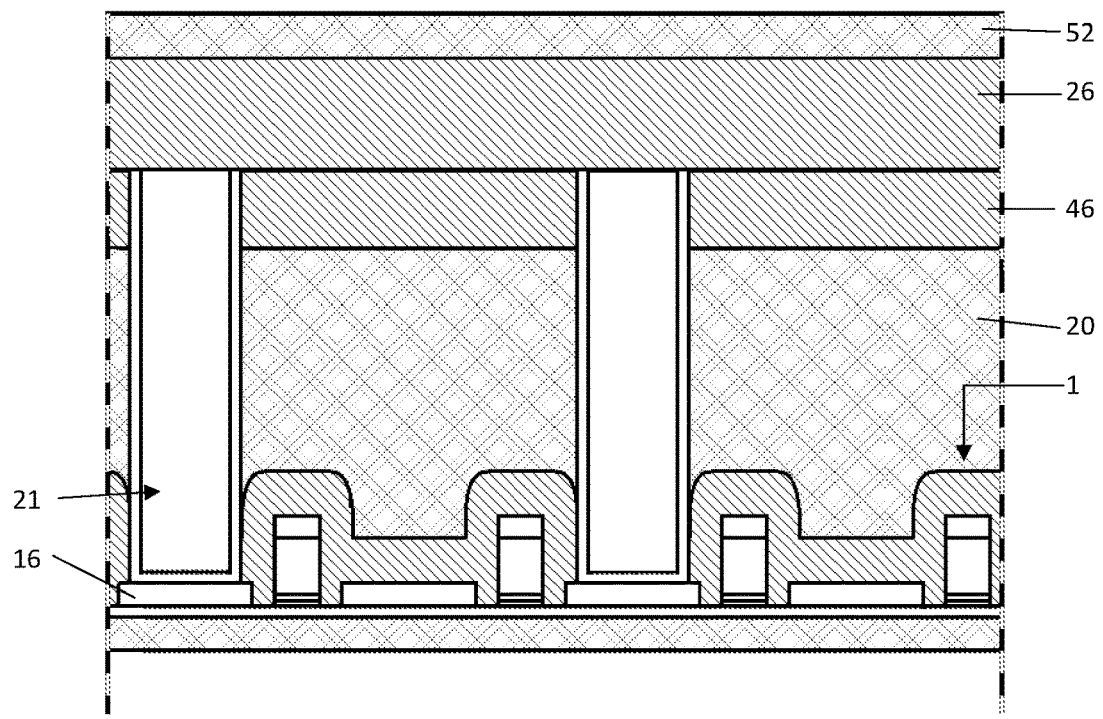

In the step illustrated in FIG. 4C, a layer 26 of silicon nitride and a layer 52 of silicon oxide are formed on the structure.

Figure 4D:
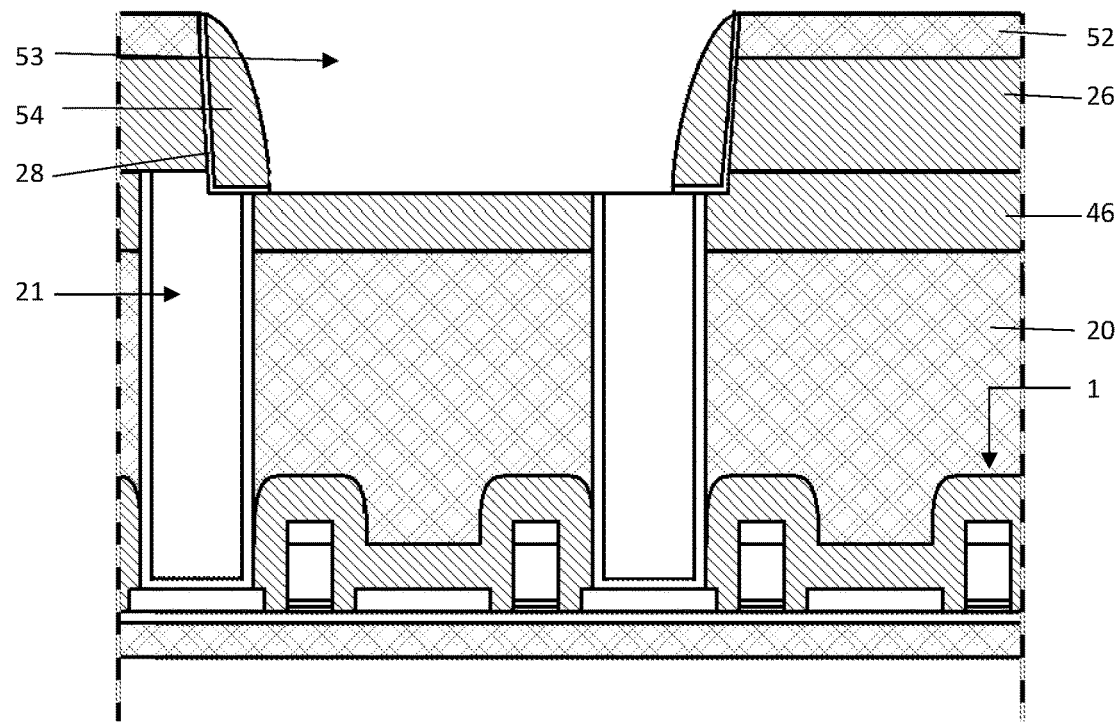

In the step the result of which is illustrated in FIG. 4D, a cavity 53 is hollowed out in the layers 26 and 52 of silicon nitride and silicon oxide. The method of etching leads to a partial etching of the layer 46 of silicon nitride and the vias 21. The case is illustrated where the etching mask of the cavity 53 is not correctly aligned. The resistive elements 28 will therefore be similarly located to those represented in FIG. 3.

A layer of resistive material (e.g. made of titanium nitride and of a thickness between 3 and 6 nm) is deposited on the structure. Spacers 54 (e.g. made of silicon nitride) are formed on the flanks of the cavity 53. The resistive material not protected by the spacers 54 is etched, thus forming L-shaped resistive elements 28. The ends of the vertical and horizontal parts of each resistive element 28, corresponding to the etching limits, are not covered by the spacers 54.

The parts of the resistive elements that overflow on one side or the other of the vias 21 and which were in contact with silicon oxide in the example in FIG. 2 are here in contact with the layer 46 of silicon nitride. The resistive elements 28 will therefore not be oxidized and will therefore not undergo any variation in resistance caused by oxidation which would risk disrupting the operation of the memory element.

Figure 4E:
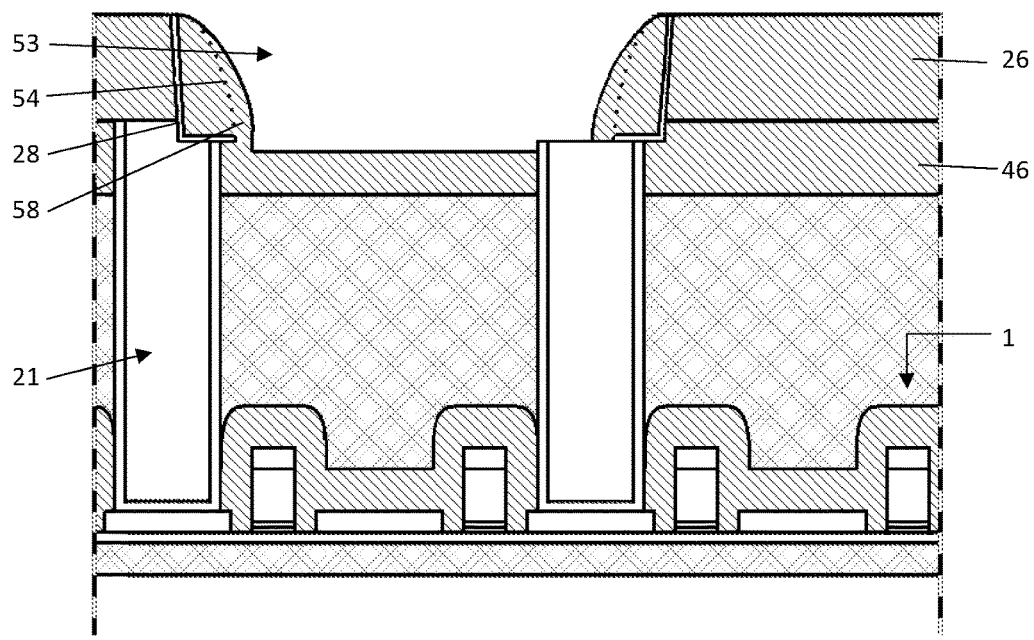

In the step the result of which is illustrated in FIG. 4E, additional spacers 58 (e.g. made of silicon nitride) are formed on the spacers 54 so as to cover the ends of the horizontal parts. In the course of this step, the layer 52 of silicon oxide has been removed, as well as the upper part of the resistive elements 28.

Figure 4F:
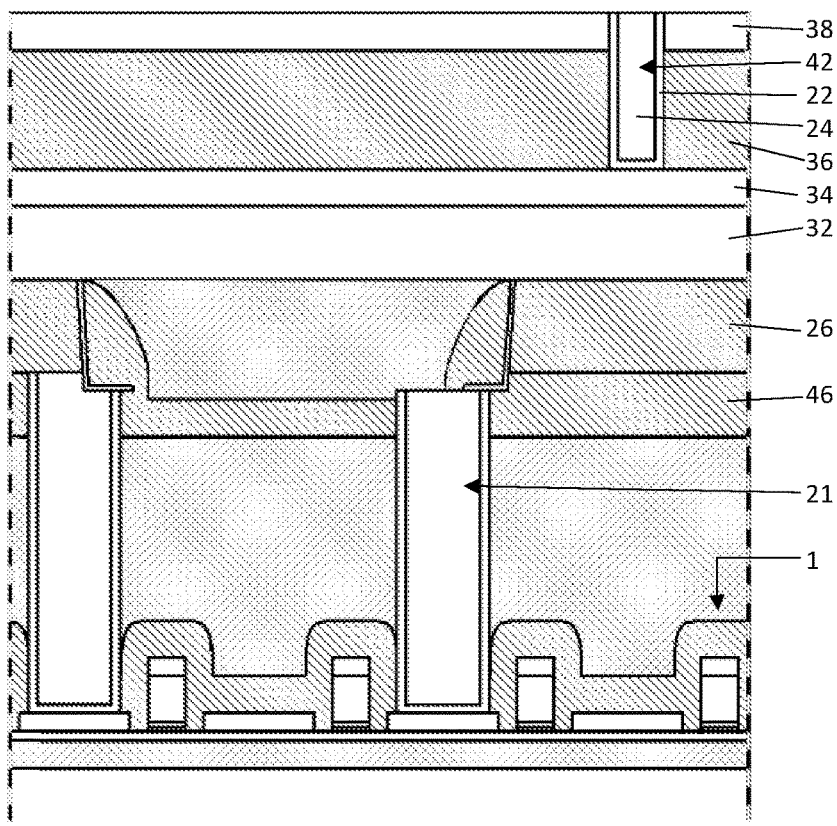

In the step illustrated in FIG. 4F, a layer of silicon oxide is deposited for filling the cavity 53, the upper surface of this layer is removed by chemical mechanical polishing or CMP to make it flat and reveal the ends of the vertical parts of the resistive elements 28. A layer 32 of phase change material (e.g. an alloy including germanium, antimony and tellurium) is deposited on the structure. The layer 32 is then in contact with the ends of the resistive elements 28.

The layer 32 of phase change material is then covered with a layer 34 of conductive material, a layer 36 of insulator (e.g. silicon nitride) and a layer 38 of insulator (e.g. silicon oxide).

A via 42 is formed across the layers of insulators 36 and 38 so as to make contact with the layer 34 of conductive material. The via 42 is sheathed with a layer 22 of conductive protection (e.g. made of Ti/TiN) and comprises a conductive core (e.g. made of tungsten).

Reading from and writing to the memory elements take place as has been described in relation to FIG. 1.

One advantage of this embodiment is that it only adds a few steps to the usual method and notably no additional masking step.

Particular embodiments have been described. Various variants and modifications will be apparent to the person skilled in the art. In particular, the selector transistors are not limited to the type of transistors described. In addition, the different materials may be replaced by equivalent materials, in particular, the silicon nitride of the layer 46 may be replaced by any other insulator not likely to react with the resistive elements 28.

The invention claimed is:

1. A method, comprising:
   depositing a first insulating layer made of a first insulating material on a second insulating layer made of a second insulating material;
   forming a conductive via traversing through the first and second insulating layers;
   depositing a third insulating layer made of the first insulating material on the first insulating layer and upper end of the conductive via;
   forming a cavity that passes through the third insulating layer and that at least partially reveals the upper end of the conductive via;
   depositing a layer of a resistive material on side walls and a bottom of the cavity and in contact with the upper end of the conductive via, wherein the first insulating material does not react with the resistive material;
   forming a first spacer on the layer of the resistive material in the cavity;
   etching away a portion of the layer of resistive material that is not protected by the first spacer;
   forming a second spacer on a side of the first spacer and which at least partially covers an end of the layer of resistive material exposed by said etching away;
   filling the cavity with a fourth insulating layer made of an insulating material; and
   depositing a layer of phase change material on the fourth insulating layer and in contact with an upper end of the layer of resistive material in the cavity.

2. The method according to claim 1, wherein the first insulating material is silicon nitride.

3. The method according to claim 1, wherein the second insulating material is silicon oxide.

4. The method according to claim 1, wherein a thickness of the first insulating layer is between 10 and 30 nm.

5. The method according to claim 1, wherein a thickness of the layer of resistive material is between 3 and 6 nm.

6. The method according to claim 1, wherein the resistive material is titanium nitride.

7. The method according to claim 1, wherein forming the cavity comprises reducing a thickness of a portion of the first insulating layer at said cavity such that an upper surface of said portion is below a top surface of the first insulating layer which is covered by the third insulating layer.

8. The method according to claim 1, wherein forming the conductive via comprises forming a first conductive via and a second conductive via, wherein the first and second conductive vias traverse through the first and second insulating layers.

9. The method according to claim 8, wherein forming the cavity forms a single cavity which that passes through the third insulating layer and that at least partially reveals the upper end of both the first conductive via and the second conductive via.

10. The method according to claim 9, wherein depositing the layer of the resistive material comprises depositing the layer of the resistive material on side walls and the bottom of the single cavity and in contact with the upper end of both the first conductive via and the second conductive via.

11. The method according to claim 10, wherein forming the first spacer comprises forming the first spacer on the layer of the resistive material in the single cavity over both the first conductive via and the second conductive via.

12. The method according to claim 11, wherein forming the second spacer comprises forming the second spacer on said side of the first spacer and which at least partially covers the end of the layer of resistive material exposed by said etching away at both the first conductive via and the second conductive via.

13. The method according to claim 1, wherein etching away the portion of the layer of resistive material that is not protected by the first spacer at least partially reveals the upper end of the conductive via.

14. The method according to claim 1, wherein the first insulating material does not cause oxidation of the resistive material.

15. The method according to claim 1, wherein the portion of the layer of resistive material that is etched away is a portion of the layer of resistive material located at the bottom of the cavity on an upper surface of the first insulating layer.

16. The method according to claim 15, wherein forming the cavity comprises reducing a thickness of a portion of the first insulating layer at said cavity such that said upper surface is below a top surface of the first insulating layer which is covered by the third insulating layer.

17. A method, comprising:
depositing a first insulating layer over an integrated circuit transistor;
forming a conductive via traversing through the first insulating layer to electrically connect with the integrated circuit transistor;
depositing a second insulating layer on the first insulating layer and upper end of the conductive via;
forming a cavity that passes through the second insulating layer and that at least partially reveals the upper end of the conductive via;
depositing a layer of a resistive material on side walls and a bottom of the cavity and in contact with the upper end of the conductive via, wherein the resistive material is made of a material which does oxidize in response to contact with a material of the first and second insulating layers;
forming a first spacer at sidewalls of the cavity, the first spacer in contact with the layer of the resistive material;
etching away a portion of the layer of resistive material that is not protected by the first spacer;
forming a second spacer on a sidewall of the first spacer and which at least partially covers an end of the layer of resistive material exposed by said etching away;
filling the cavity with an insulating oxide material, the first and second spacers protecting the layer of resistive material from being oxidized; and
depositing a layer of phase change material on the insulating oxide material and in contact with an upper end of the layer of resistive material in the cavity.

18. The method according to claim 17, wherein the resistive material is titanium nitride.

19. The method according to claim 17, wherein forming the cavity comprises reducing a thickness of a portion of the first insulating layer at said cavity such that an upper surface of said portion is below a top surface of the first insulating layer which is covered by the second insulating layer.

20. The method according to claim 17, wherein etching away the portion of the layer of resistive material that is not protected by the first spacer at least partially reveals the upper end of the conductive via.

21. The method according to claim 17, wherein the portion of the layer of resistive material that is etched away is a portion of the layer of resistive material located at the bottom of the cavity on an upper surface of the first insulating layer.

22. The method according to claim 21, wherein forming the cavity comprises reducing a thickness of a portion of the first insulating layer at said cavity such that said upper surface is below a top surface of the first insulating layer which is covered by the second insulating layer.

* * * * *